(12) United States Patent
Tauchi et al.

(10) Patent No.: US 8,740,011 B2
(45) Date of Patent: Jun. 3, 2014

(54) VACUUM PROCESSING APPARATUS

(75) Inventors: Susumu Tauchi, Shunan (JP); Akitaka Makino, Hikari (JP)

(73) Assignee: Hitachi High-Technologies Corporation, Tokyo (JP)

( * ) Notice: Subject to any disclaimer, the term of this patent is extended or adjusted under 35 U.S.C. 154(b) by 99 days.

(21) Appl. No.: 13/282,561

(22) Filed: Oct. 27, 2011

(65) Prior Publication Data

US 2012/0091386 A1  Apr. 19, 2012

Related U.S. Application Data

(63) Continuation of application No. 12/651,701, filed on Jan. 4, 2010, now Pat. No. 8,286,822, which is a continuation of application No. 11/068,990, filed on Mar. 2, 2005, now Pat. No. 7,641,069.

(30) Foreign Application Priority Data

Sep. 10, 2004 (JP) ................................. 2004-263968

(51) Int. Cl.
*B65D 6/40* (2006.01)
*B65D 53/02* (2006.01)
*B65D 43/04* (2006.01)

(52) U.S. Cl.
USPC ........ 220/661; 220/211; 220/378; 220/345.1; 220/360; 220/806

(58) Field of Classification Search
USPC .............. 220/211, 661, 231, 345.1, 360, 378, 220/203.28, 806
See application file for complete search history.

(56) References Cited

U.S. PATENT DOCUMENTS

| | | | |
|---|---|---|---|
| 634,394 A * | 10/1899 | Conrad | 217/109 |
| 2,091,791 A | 8/1937 | Newman | |
| 2,426,800 A | 9/1947 | Triplett | |
| 2,593,712 A | 4/1952 | Wells et al. | |
| 2,663,268 A * | 12/1953 | Ahnell | 105/456 |
| 2,690,275 A | 9/1954 | Alt et al. | |
| 3,690,505 A * | 9/1972 | Schoonman et al. | 220/328 |
| 3,695,482 A * | 10/1972 | Smith | 220/328 |
| 3,858,752 A | 1/1975 | Marvin et al. | |
| 3,901,407 A | 8/1975 | Mitchell et al. | |
| 4,334,633 A | 6/1982 | Piegza | |

(Continued)

FOREIGN PATENT DOCUMENTS

| | | |
|---|---|---|
| JP | 08-060374 | 3/1996 |
| JP | 2002-081555 | 3/2002 |
| JP | 2002-276825 | 9/2002 |

*Primary Examiner* — Mickey Yu
*Assistant Examiner* — Niki Eloshway
(74) *Attorney, Agent, or Firm* — Antonelli, Terry, Stout & Kraus, LLP.

(57) ABSTRACT

A vacuum processing apparatus that includes a vacuum vessel; an opening disposed in a wall of the vacuum vessel, through which a sample to be processed is taken in and out; a valve body disposed outside the wall for airtightly sealing the opening; and a drive unit driving the valve body to carry out a sealing or opening operation. The drive unit includes a first member coupled to an actuator that moves along a substantially linear first direction as a result of operation of the actuator, and a second member coupled to the first member that moves along a substantially linear second direction that intersects with the first direction. The valve body, coupled to the second member, seals the opening as a result of movement of the second member.

19 Claims, 11 Drawing Sheets

(56) References Cited

U.S. PATENT DOCUMENTS

| | | |
|---|---|---|
| 4,566,375 A | 1/1986 | Van der Schoot |
| 5,336,375 A | 8/1994 | Wallskog et al. |
| 5,489,041 A | 2/1996 | Matthews et al. |
| 5,547,102 A | 8/1996 | Rule et al. |
| 5,746,359 A | 5/1998 | Stanek et al. |
| 5,967,363 A | 10/1999 | Allen |
| 6,048,494 A | 4/2000 | Annapragada |
| 6,264,829 B1 | 7/2001 | Antalffy et al. |
| 6,390,145 B1 | 5/2002 | Okabe et al. |
| 6,761,360 B2 | 7/2004 | Hammi |
| RE39,721 E | 7/2007 | Garton |
| 7,578,407 B2 | 8/2009 | Tieben et al. |
| 2004/0007581 A1 | 1/2004 | Nguyen et al. |
| 2006/0060259 A1 | 3/2006 | Devitt |
| 2006/0249512 A1 | 11/2006 | Ueda et al. |

\* cited by examiner

VACUUM PROCESSING APPARATUS

This application is a Continuation application of application Ser. No. 12/651,701, filed Jan. 4, 2010 now U.S. Pat. No. 8,286,822, which is a Continuation application of application Ser. No. 11/068,990, filed Mar. 2, 2005 now U.S. Pat. No. 7,641,069, the contents of which are incorporated herein by reference in their entirety.

The present application is based on and claims priority of Japanese patent application No. 2004-263968 filed on Sep. 10, 2004, the entire contents of which are hereby incorporated by reference.

BACKGROUND OF THE INVENTION

1. Field of the Invention

The present invention relates to a vacuum processing apparatus, and also relates to a vacuum processing apparatus equipped with a gate valve for airtightly sealing or opening a gate for communicating the inside and the outside of a vacuum vessel in which a sample is processed.

2. Description of the Related Art

In the field of apparatuses for processing an object in a decompressed chamber, such as the one mentioned above, there is a demand for improving the efficiency for processing the substrate being the object of processing, in addition to enhancing the minuteness and preciseness of the process. Therefore, in recent years, a multi-chamber apparatus has been developed in which a plurality of processing chambers are connected and combined as a single apparatus, enabling various processes to be performed to the substrate in a single apparatus, and improving the process efficiency.

In such an apparatus having plural processing chambers, each of the processing chambers are connected to a transfer chamber capable of having its inner gas or pressure controlled, which is equipped with a robot arm or the like for transferring the substrate inside thereof.

According to such structure, the pre-processed or post-processed substrate is transferred through the transfer chamber having its interior evacuated or supplied with inert gas from one processing chamber to another processing chamber, so that the substrate is subjected to continuous processing without being in contact with atmosphere outside. Thus, the contamination of the substrate is suppressed and the yield or efficiency of the process is improved.

Further, the time for increasing/decreasing the pressure in the processing chambers or the transfer chamber can be omitted or reduced, by which the processing steps are shortened and the work and time required for the overall substrate processing are reduced, and the processing efficiency is thereby improved.

According further to such apparatus, each processing chamber is detachably attached to the apparatus, so that by replacing the processing chambers or by changing the combination thereof, the apparatus can correspond to perform a new process without having to replace the whole apparatus. As a result, the costs for manufacturing products by processing the substrates in the apparatus can be cut down.

A known valve device called a gate valve for airtightly closing and opening an opening (gate) disposed with the chamber through which the sample is taken in and out of the processing chamber or the transfer chamber includes a valve body attached to an end of a beam-shaped member such as a shaft that is connected to a drive device such as an actuator. In such a gate valve, when the gate is to be closed, the actuator drives the valve body toward the opening while maintaining a predetermined distance with the surface of the chamber wall on which the gate is disposed, and when the valve body reaches a position substantially confronting the gate opening, the valve body is Moved toward the opening until one surface of the valve body connects to the chamber wall or the gate opening.

In the above-mentioned arrangement, a seal member is disposed on one surface of the valve body for airtightly sealing the area between the valve body and the chamber wall or the gate opening. In the seal member, a dent or groove is disposed that extends to cover the whole length of the connection surface (seal surface) of the valve body which is to be sealed, and the seal member having elasticity is fit into this groove so that the seal member is positioned correctly and is prevented from being displaced on the valve body. The seal member disposed on the surface of the valve body is pressed against the wall or the opening to seal the space therebetween, and the seal member is also pressed against the surface of the dent or the groove to seal the space therebetween.

When opening the gate, the actuator moves the valve body being connected to the wall or the opening away from the gate. After separating the valve body from the chamber wall or opening, the valve body is moved away from the opening while maintaining a predetermined distance from the chamber wall, similar to when closing the gate.

Japanese Patent Application Laid-Open Publication Nos. 2002-276825 and H08-060374 disclose prior art gate valves of the type described above. Further, Japanese Patent Application Laid-Open Publication No. 2002-81555 discloses a prior art sealing means.

The prior art apparatuses had the following drawbacks. According to the prior art gate valve, when moving the valve body of the gate valve away from the gate opening, since the valve body is connected to the opening with high pressing force, the seal portion of the valve body may not be removed in uniform fashion, or large force must be applied when removing the seal, by which the valve body is vibrated by the shock of removal from the gate. This causes deposits such as reaction products attached to the process chamber wall or the surface of the valve during processing to fall by the vibration onto the sample and causing contamination or corrosion of the sample, or causes contamination of the members inside the processing chamber.

Thus, it is necessary to reduce vibration during movement of the valve body, but the prior art disclosures lack to provide sufficient measures.

According further to the gate valve of the prior art, the valve body is moved toward the opening until the valve body contacts the opening or the wall surface surrounding the opening, or the valve body is moved away therefrom, but if the valve body is designed to move along a guide such as a rail disposed in the direction of movement thereof, the gap disposed between the guide and the member being guided or the friction therebetween causes the valve body to vibrate.

Furthermore, as described above, a seal member having elasticity is disposed on the surface of the valve body of the gate valve coming into contact with the chamber wall or the opening, which covers the whole length surrounding the area to be sealed. However, according to the prior art, the seal member was positioned by fitting the seal member in the groove or dent disposed in the valve body, and the fitting of the seal member required time and work, so the time required for maintenance and testing operations was increased, and the overall operation efficiency of the apparatus was deteriorated.

Even further, the seal member is normally ring-shaped with a round cross-section, but while fitting the seal member into the groove or dent, the seal member may be twisted and rotated, and if the seal is connected in that state to the wall surface or opening, the deformation by the twist may prevent sufficient seal from being created, or cause the seal performance to be varied in various areas of the connecting surface, deteriorating the sealing performance. Especially, when divided molds are used to mold the seal member, a fin may be disposed in the seam portion by the seal member material running out of the mold, and when this fin is brought into contact with the chamber wall or opening by the twisting of the seal member, it may prevent the seal member from being pressed onto the wall or opening with uniform pressure, and may cause partial deterioration of the sealing performance.

Moreover, since the prior art valve body was designed to close and seal the opening of the gate disposed in a flat wall, the seal surface of the valve body was formed flat. However, the processing chamber disposed inside a vacuum vessel has a substantially cylindrical form, so if the valve body of the gate valve for sealing the gate leading to the processing chamber is shaped like a plate or the portion facing the gate is flat, the inner wall surface of the processing chamber becomes uneven, and the process performed within the processing chamber is affected thereby and becomes uneven. On the other hand, if the valve body is shaped to correspond to the inner wall surface shape of the processing chamber, the projection to be inserted into the opening must be disposed at the center of the valve body and the valve body must be moved within the opening for a distance corresponding to the height of the projection. Especially when the projection is disposed to correspond to a cylindrical wall, the valve body must be moved for a long distance, requiring an additional mechanism for moving the valve body for a long distance, which causes the apparatus to become larger, or causes the valve body to vibrate due to the interaction with the guide. Further, if a groove or dent according to the prior art must be disposed in the seal surface, the groove or dent must be disposed in the curved surface, which requires much work and time, increasing the manufacturing costs and deteriorating the efficiency. Furthermore, fitting the seal member into the groove or dent disposed in the curved surface may require long work time, which may also cause the local deterioration of the sealing performance.

SUMMARY OF THE INVENTION

The object of the present invention is to provide a highly reliable plasma processing apparatus with a stable sealing performance.

Another object of the present invention is to provide a plasma processing apparatus capable of facilitating related work and reducing the manufacturing costs thereof.

The objects of the present invention are achieved by a vacuum processing apparatus comprising a vacuum vessel having its inside decompressed; an opening disposed in a wall of the vacuum vessel for communicating the inside with the outside thereof and through which a sample to be processed is taken in and out; a valve body disposed outside the wall for airtightly sealing or opening the opening; and a drive unit for driving the valve body to carry out the sealing or opening operation, the drive unit comprising a first member coupled to an actuator that moves along a substantially linear first direction as a result of operation of the actuator, a second member coupled to the first member that moves along a substantially linear second direction that intersects with the first direction, and the valve body coupled to the second member that seals the opening as a result of the movement of the second member.

Moreover, the objects of the present invention are achieved by further providing a rail coupled to either one of the first member or the second member and moves together therewith, and a slide member coupled to the other member that moves together therewith and also along the rail.

Even further, the objects of the present invention are achieved by the second member moving along the second direction that is relatively obtuse to the direction in which the first member moves along the first direction.

Furthermore, the objects of the present invention are achieved by providing a guide member disposed on a side of the second member on which the first member moves for restraining the movement of the second member along the first direction and relatively moving the second member along the second direction.

The objects of the present invention are also achieved by a vacuum processing apparatus comprising: a vacuum vessel having its inside decompressed; an opening disposed in a wall of the vacuum vessel for communicating the inside with the outside thereof and through which a sample to be processed is taken in and out; a valve body disposed outside the wall for airtightly sealing or opening the opening; and a drive unit for driving the valve body to carry out the sealing or opening operation, the drive unit comprising a pair of second members disposed respectively on one end side and another end side of the valve body; support members coupled to each of the second members that are connected to and supporting the valve body; and a biasing device having elasticity disposed between the pair of second members and a pair of first members that are respectively coupled to the pair of second members, for mutually biasing and connecting the first and second members.

Moreover, the objects of the present invention are achieved by the valve body being connected to support pillars at one end side and another end side of the valve body respectively, and the support pillars being connected to the support members coupled to the pair of second members.

Further, the objects of the present invention are achieved by the biasing device damping the relative movement of the first member and the second member.

DETAILED DESCRIPTION OF THE PREFERRED EMBODIMENTS

The preferred embodiments of the present invention will now be described with reference to the drawings.

Figure 1A:
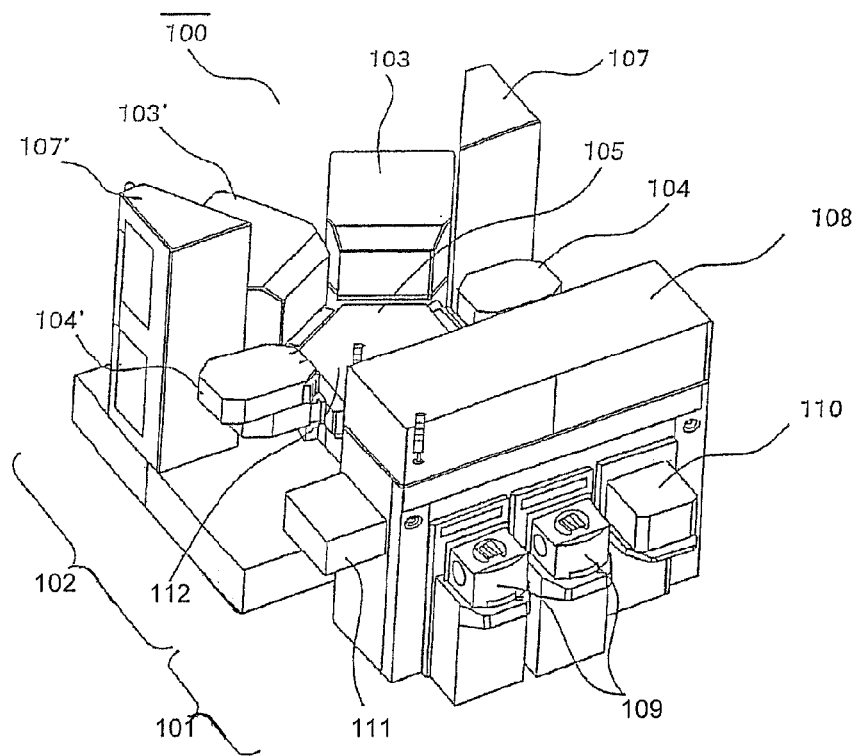
FIG. 1(a) is a front perspective view showing the whole structure of the vacuum processing apparatus according to the present invention.
Figure 1B:
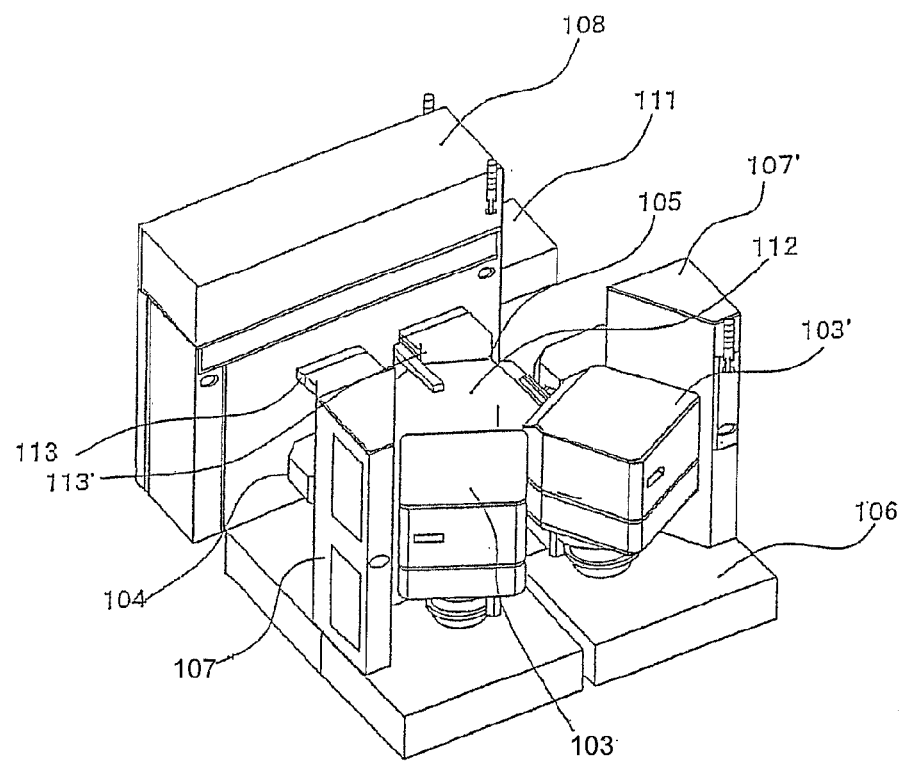
FIG. 1(b) is a rear perspective view showing the whole structure of the vacuum processing apparatus shown in FIG. 1(a)

An embodiment of the present invention will be described with reference to FIGS. 1 through 4. FIG. 1 is a perspective view showing the whole structure of a vacuum processing apparatus according to a preferred embodiment of the present invention. FIG. 1(*a*) is a perspective view taken from the upper front oblique direction, and FIG. 1(*b*) is a perspective view taken from the upper rear oblique direction.

In the present drawing, a vacuum processing apparatus 100 according to the embodiment is divided largely into two blocks, a front block and a rear block. The front block of the apparatus body 100 is an atmospheric block 101, in which a wafer supplied into the apparatus is transferred to a chamber that is decompressed under atmospheric pressure, and then supplied into a processing chamber. The rear block of the apparatus body 100 is a processing block 102. The processing block 102 is equipped with processing units 103, 103', 104 and 104' each having a processing chamber that can be decompressed in order to process wafers, a carriage unit 105 for transferring wafers under decompressed condition into these chambers, and a plurality of lock chambers connecting the carriage unit 105 and the atmospheric block 101, wherein these units are capable of being decompressed and maintained at a high degree of vacuum, and wherein the processing block is a vacuumed block.

The atmospheric block 101 has a casing 108 containing a carrier robot (not shown), and the casing 108 has attached thereto wafer cassettes 109 for storing processing and/or cleaning wafers and a dummy cassette 110 for storing dummy wafers. Further, the carrier robot functions to transfer in/out wafers between these cassettes 109 and 110 and a lock chamber unit 106. The atmospheric block 101 has a positioning unit 111 disposed on the casing 108, and in the positioning unit 111, the wafer to be transferred is positioned to correspond to the desired wafer orientation in the cassettes 109, 110 or in the lock chamber unit 106.

Out of the processing units 103, 103', 104 and 104' in the processing block 102 according to the present embodiment, processing units 103 and 103' are etching units equipped with an etching chamber for etching the wafers transferred from the cassette 109 into the processing block 102, and processing units 104 and 104' are ashing units for ashing the wafers, wherein the carriage unit 105 is equipped with a transfer chamber 112 that is maintained at a high degree of vacuum and to which the processing units are attached in detachable manner.

Further, the processing block 102 has control units 107 and 107' including a mass flow controller for controlling the supply of fluids such as gas and liquid to the units and the processing chambers, which are disposed between and adjacent to processing units 103, 103', 104 and 104'. Frames 106 storing rectangular beds for housing storage units and evacuation units for gases and refrigerants required in the above-mentioned processing units and utilities such as power supplies for supplying power thereto are disposed under the processing block 102. The processing chamber portions of the processing units 103 and 104, the control unit 107 and the beds are detachably attached and arranged to the frame 106.

Figure 2A:
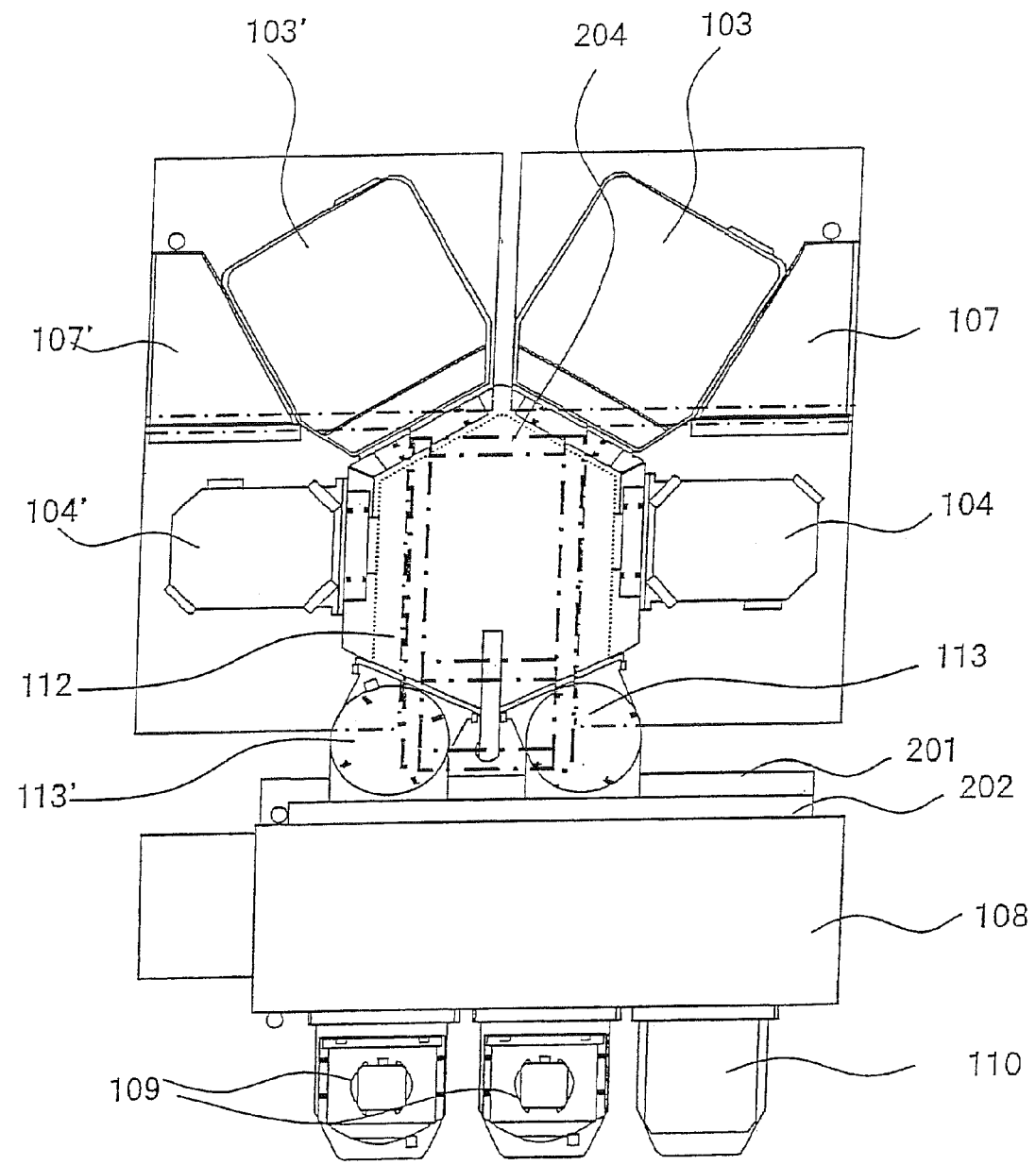
FIG. 2(a) is an upper view showing the outline of the structure of the vacuum processing apparatus shown in FIG. 1.
Figure 2B:
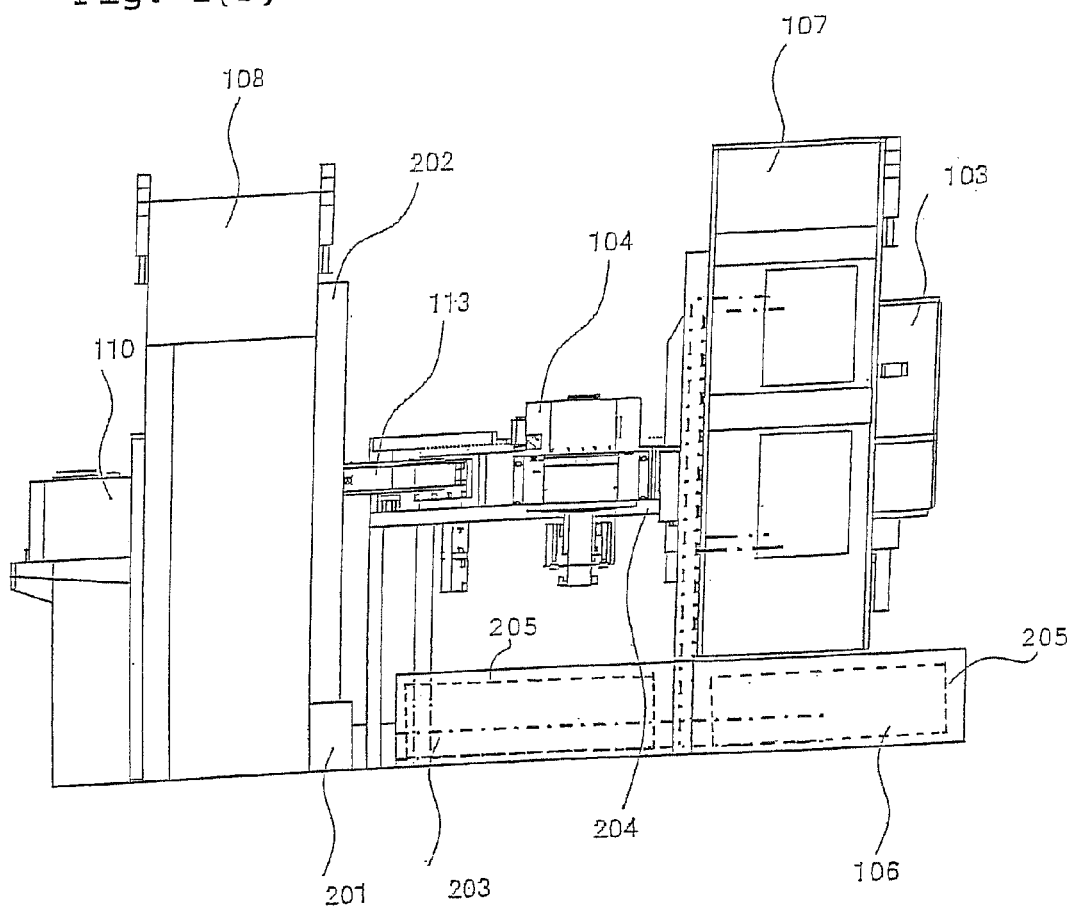
FIG. 2(b) is a side view showing the outline of the structure of the vacuum processing apparatus shown in FIG. 1.
Figure 3A:
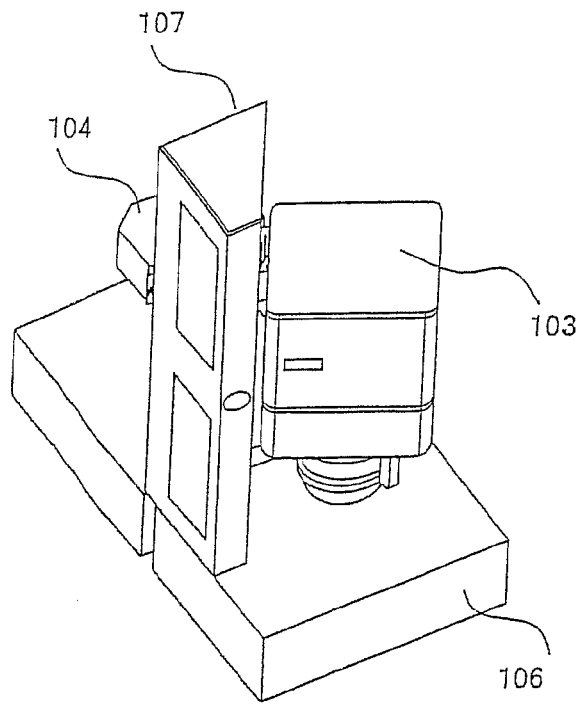
FIG. 3 is a perspective view showing the outline of the structure of each unit.
Figure 3B:
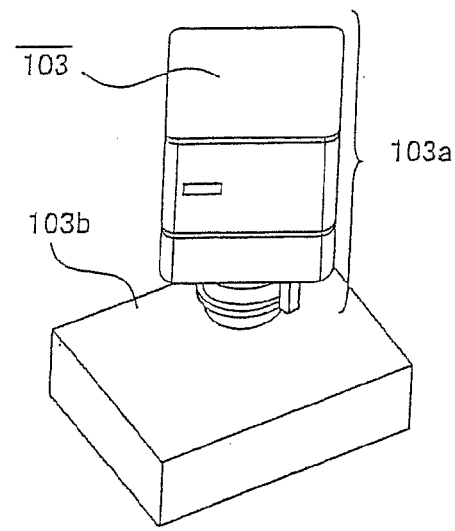
Figure 3C:
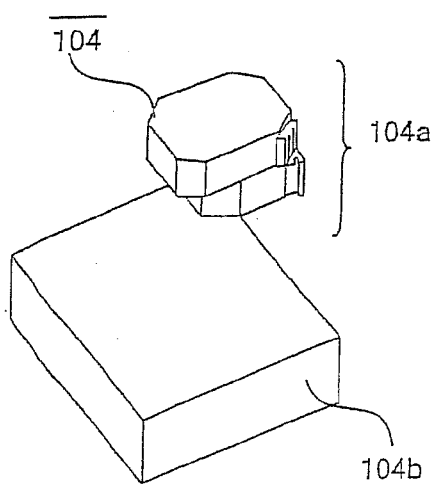
Figure 3D:
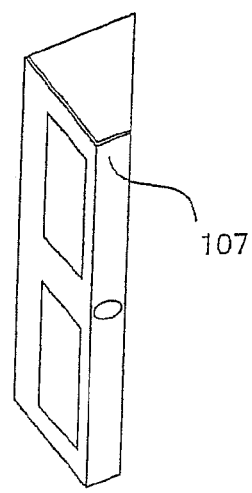

FIG. 2 is a plan view showing the schematic structure of the vacuum processing apparatus 100 according to the embodiment shown in FIG. 1, wherein FIG. 2(*a*) is a view taken from above, and FIG. 2(*b*) is a view taken from the side. In the present embodiment, the atmospheric block 101 arranged in the front side of the apparatus body 100 is for handling (transferring, storing, positioning etc.) the wafer in atmospheric pressure, and the processing block 102 at the rear side is for transferring and processing the wafer in a pressure decompressed from atmospheric pressure and for reducing/increasing the pressure with the wafer placed therein.

As mentioned earlier, lock chambers 113 and 113' are disposed between the transfer chamber 112 constituting the carriage unit 105 and the atmospheric block 101 for connecting and enabling wafers to be transferred between the chamber 112 and block 101. A wafer is carried into the decompressed lock chamber 113 or 113' by a robot arm (not shown) disposed within the transfer chamber 112, and then the pressure of the lock chamber is raised to atmospheric pressure, before the wafer is transferred on another robot arm (not shown) disposed within the atmospheric block 101 to be taken out into the atmospheric block 101. The wafer being taken out is either returned to its original position in the cassette 109 or returned to another cassette. Further, a wafer taken out from any of the cassettes 109 is placed in a lock chamber 113 or 113' set to atmospheric pressure, then the lock chamber is decompressed, before the wafer is placed on the robot arm disposed within the transfer chamber 112 also being decompressed and transferred through the transfer chamber 112 into any of the processing units 103, 103' 104 or 104'.

In order to carry out the above operation, the lock chambers 113 and 113' are connected to a gas evacuation unit and a gas supply unit for increasing, decreasing and maintaining the interior pressure of the lock chamber while having the transferred wafer placed therein, connected between the atmospheric block 101 and the transfer chamber of the carriage unit. Therefore, the lock chamber 113 is equipped with gate valves (not shown) disposed in the front and rear of the chamber that can be opened/closed to airtightly seal the interior of the lock chamber. A stage for mounting the wafer is disposed inside the lock chamber, which is equipped with a means for holding the wafer so as to prevent the wafer from moving during increase and decrease of inner pressure. In other words, the lock chambers 113 and 113' are equipped with means for sealing the chamber with the wafer placed therein, capable of enduring the created inner and outer pressure difference.

As described above, the carriage unit 105 is composed of the transfer chamber 112 having its interior decompressed and equipped with a robot arm (not shown) for transferring the wafer between the processing chambers 103, 104 and lock chambers 113, and the plurality of lock chambers 113 and 113'. In the present embodiment, a single sample carriage device 506 is disposed inside the transfer chamber 112 for transferring samples between the four processing units arranged around the transfer chamber 112 and the atmospheric block 101.

According further to the present embodiment, the processing units 103, 103', 104 and 104' are composed of two etching units and two asking units, the units being connected to each face of a transfer chamber 112 of the carriage unit 105, which has a nearly polygonal shape in planar, wherein the two etching units 103 and 103' are connected to the two sides on the deeper end of the transfer chamber 112 and the two ashing units 104 and 104' are connected to the side faces adjacent to the etching units 103 and 103', respectively. The lock chambers 113 and 113' are connected to the remaining sides of the transfer chamber 112. Thus, the present embodiment has two etching chambers and two ashing chambers disposed around the transfer chamber 112.

According to the present embodiment, the processing units 103, 103', 104 and 104' connected to the carriage unit 105 are detachably attached to the carriage unit 105, and in the carriage unit 105, the lock chambers 113 and 113' and the transfer chamber 112 are detachably connected.

In the present embodiment, the processing block 102 including the processing units 103, 103', 104 and 104' and the carriage unit 105 is divided largely into upper and lower parts, which are, a chamber portion having its interior decompressed for handling the sample such as a semiconductor wafer being the object of processing, and a frame 106 disposed below the chamber portion for supporting the same, containing equipments required for the chamber. Further, the processing unit is divided into a chamber portion containing the processing chambers and a bed portion housing the utilities corresponding to these processing chambers.

In the present embodiment, the frame 106 is composed of a center frame 204 disposed below the transfer chamber 112 and four bed frames 205 that surround the center frame. The center frame 204 is a support table disposed below the carriage unit 105 or the transfer chamber 112 for supporting the same and the processing units and equipment connected thereto, which is structured in a substantially rectangular form with beams that provide necessary strength. There is a space provided in the inside of the center frame 204 for storing the necessary pipes and wires for the above-mentioned utilities and various processing units.

Further, the center frame 204 is disposed near the center of the transfer chamber 112, and especially in the present embodiment, is positioned within the projection of the transfer chamber 112 to the floor, with the bed frames 205 for the processing units disposed around the center frame 204. In other words, four substantially rectangular bed frames 205 are disposed either on the four sides of the substantially rectangular center frame 204 or facing these sides at positions spaced somewhat therefrom. At this time, the bed frames 205 are disposed to be underneath the transfer chamber 112 and placed to overlap with the projection of the transfer chamber 112 on the floor, so as to further reduce the footprint of the processing block 102.

In the present embodiment, the bed portion is composed of a bed frame and a bed housed within the bed frame. The bed portion is substantially rectangular, and houses utilities, a controller, a heat exchanger etc. required in the upper chamber portion. The bed frame has enough strength to support the chamber portion disposed thereabove, having a substantially rectangular shape formed of beams, and having the bed disposed therein and a plate covering the same disposed on the outside.

Utilities can include, for example, an exhaust pump for decompressing the processing chamber, a temperature controller, power supplies for supplying power to various sensors etc., a signal interface for receiving signals input to and output from the various processing units and for controlling the same, gas storage unit for supplying gas to a sample stage for mounting and fixing a wafer (sample) in the processing chamber, a refrigerant storage unit for storing the refrigerant used for cooling the sample stage, and a heat exchanger of a refrigeration cycle for heat-exchanging and recycling the refrigerant.

The bed stores these utilities, and is connected to and housed in the substantially rectangular bed frame. Moreover, the bed frame 205 constituting this frame 106 stores interface units required to drive these various utilities housed in the bed. The processing chamber portion is connected to plural sides of the transfer chamber 112 via predetermined connecting gates. The bed portion corresponding to this processing chamber portion is stored in the frame underneath the transfer chamber 112 and connected to the equipment body 100.

In the present embodiment, a combination of each processing chamber portion and the bed portion corresponding thereto constitutes a single processing unit. This single processing unit is connected as one component to the equipment main body 100 or the carriage unit 105 (transfer chamber 112) in detachable manner. Further, in a single processing unit, it is possible to have the corresponding bed portion underneath attached thereto/detached therefrom while the processing portion is connected to the carriage unit 105, or oppositely, have the corresponding processing chamber portion thereabove attached thereto/detached therefrom while the bed portion is connected to the frame 106.

At the rear side of the atmospheric block 101 between the processing block 102 are lock chambers 113, but a gap is disposed between the rear side and the frame 106 or the beds. The rear side of the atmospheric block 101 provides a supply passage for gas, refrigerant, power and the like to be fed to the processing block. The present vacuum processing apparatus 100 is typically located in a clean room or the like having purified air, and if plural apparatus are installed, the various gases, refrigerant and power supplies to be fed to the apparatus 100 are typically located in a different location, such as collectively on a floor different from the floor on which the present apparatus is installed, and supplied to the apparatus main body via gas and refrigerant pipes or power lines. In the present embodiment, a connection interface 201 for the supply lines such as the gas and refrigerant pipes and power lines from a different location is disposed on the rear wall portion of the atmospheric block.

The connection interface 201 is further connected to supply paths of various utilities to be supplied to the processing block 102. The supplied pipes and power lines from the connection interface 201 are gathered in a supply block 203, that is passed below the lock chamber 113 and the center portion of the transfer chamber 112, and connected to each bed via interface portions provided to each bed frame 205 constituting the frame 106. A part of the gas etc. required for processing is supplied through a supply passage 204 disposed between processing units 103 and 104 and on the control unit 107 to be connected to the control unit 107.

According to the prior art, the pipelines and power lines were designed to be introduced independently into the plural processing chambers from the supply sources on the separate floor, so when the processing chamber had to be subjected to maintenance, adjustment or replacement, the work related to detaching and reattaching the lines were complicated, deteriorating the work efficiency. Further, the display means (meters) for displaying the status of flow of these pipelines and power lines were disposed on each of the plural processing chambers, so it was difficult for the operator to determine the operation status of the apparatus. Moreover, since the pipelines were disposed around the processing chambers, the footprint of the whole apparatus became substantially large, by which the number of apparatuses that can be disposed on a single floor was reduced, and the workspace was reduced, deteriorating the work efficiency. According to the present embodiment, the above-described arrangement ensures sufficient work space, enables easy status confirmation, and reduces footprint.

That is, a display unit 202 having a detecting means for detecting the status of each supply line connected via the connection interface 201 and supplied to the processing block 102 equipped with a display means for displaying the result of output of the detecting means is disposed on the rear wall of the casing 108 so as to enable the operator to check the operation status of the apparatus easily. It is also possible to dispose an adjustment means for adjusting the supply through these supply lines or for entering orders for adjustment.

Furthermore, a gap is provided between the rear wall of the casing 108 and the frame 106 of the processing block 102, which provides space for the operator to enter and work on the processing unit 104, the transfer chamber 112 and the lock chamber 113, and also to confirm the display portion 202 on the rear wall of the casing 108 or the connection interface 201, or to adjust and perform maintenance of the same. Moreover, means for displaying information related to the operations of the devices receiving supply from the supply lines and for controlling the same are collectively disposed. Therefore, the work related to the operation of the apparatus is facilitated, and the operation efficiency of the apparatus is improved.

According further to the present embodiment, the supply lines of necessary utilities for each unit constituting the processing block 102 are collectively located. By collectively disposing on the rear wall of the casing 108 of the atmospheric block 101 the supply paths such as the pipelines and power lines from a separate location such as the floor beneath the installation floor of the apparatus 100, the work related to installing the apparatus body 100 on the floor and the work related to attaching, connecting and detaching the supply paths during maintenance and replacement of the apparatus is facilitated, by which the work efficiency is improved.

According to the present embodiment, the supply lines such as the pipelines and power lines from the connection interface 201 are collectively disposed and passed beneath the lock chamber 113 and the center of the transfer chamber 112, and in the present embodiment, is disposed in the interior space of a center frame 204 positioned under the transfer chamber 112, being connected to each bed via an interface portion disposed on a bed frame 205 constituting the frame 106. However, the pipelines and power lines from the connection interface 201 can be connected directly to the device housed in the bed of the frame 106.

In other words, each unit is positioned to surround the transfer chamber 112, and the space for the supply lines 203 is positioned in the inner side or near the center of the apparatus. This space is positioned under the transfer chamber 112 and the lock chamber 113, and between the beds of each processing unit. Thus, the space for work related to attaching, connecting and detaching the supply lines 203 is ensured, facilitating work and improving work efficiency, and as a result, improving the operation efficiency of the apparatus. Further, since the connecting portion of the utilities is disposed in the inner side of the apparatus, that is, under the transfer chamber 113, and facing the space provided between the beds, the above-mentioned space for work is minimized, and in comparison to the case where the pipes, lines and connecting portions are disposed around the apparatus, the footprint of the apparatus is reduced, and the number of apparatuses that can be installed on the same area is increased.

FIG. 3 is a perspective view showing the outline of the structures of the various units according to the present embodiment shown in FIG. 1. FIG. 3(a) shows the assembled state of the processing units. FIGS. 3(b), 3(c) and 3(d) show each processing unit independently. FIG. 3(b) shows an etching unit 103, FIG. 3(c) is an ashing unit 104, and FIG. 3(d) is a control unit containing a mass flow controller (MFC).

As illustrated, the processing units 103 and 104 are each equipped with processing units 103a and 104a, and connected bed portions 103b and 104b housed in the frame 106, which are disposed vertically. In the etching unit 103, pipelines and power lines for supplying gas, recycling refrigerant and providing power are disposed between the processing units 103a and 103b and connecting the same, and the processing unit 103a is supported above the bed by plural support beams disposed above the frame 106 not shown. A control unit 107 is disposed between the etching unit 103 and the ashing unit 104, and attached to the upper side of the fame 106 of the bed portions 103b and 104b of these processing units. The control unit 107 is for controlling the supply of gas etc. required in the processing units disposed adjacent thereto. For example, a flow controller disposed inside the control unit controls the supply of gas and power to the processing chamber disposed within the processing unit 103a of the etching unit 103.

Figure 4:
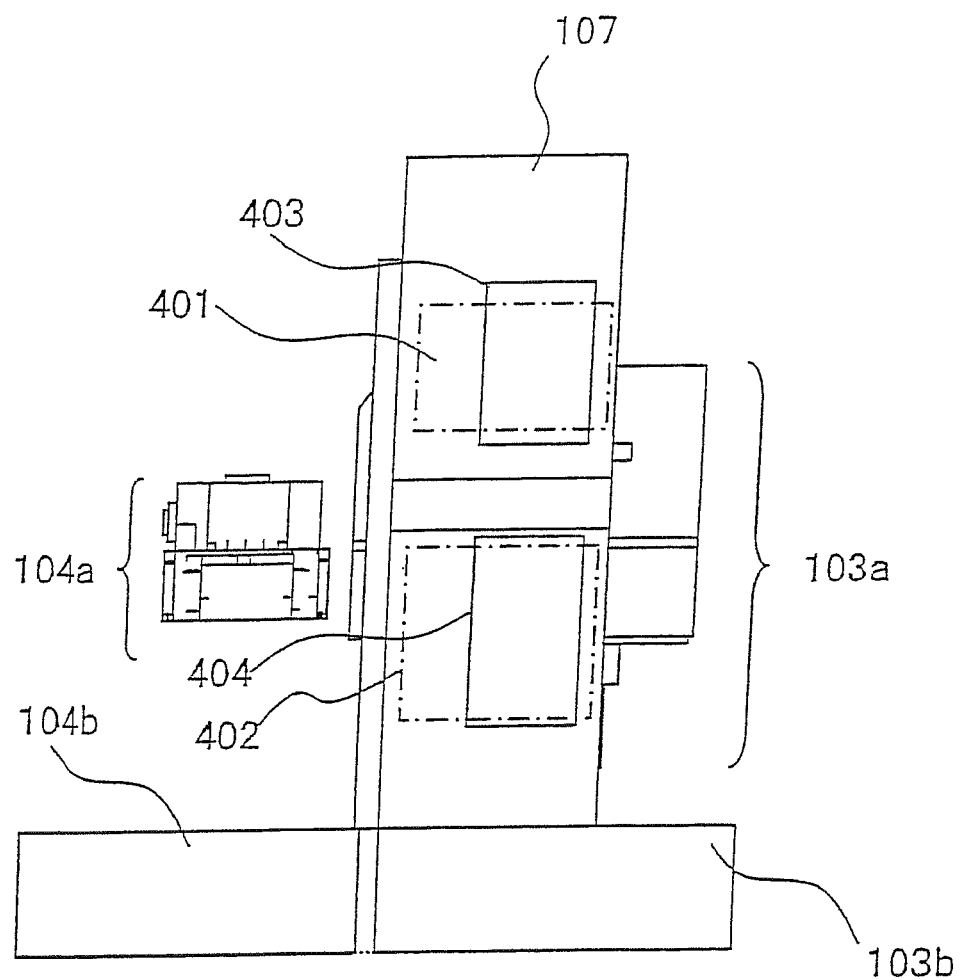
FIG. 4 is a side view showing the positional relationship between the control unit and each processing unit according to the embodiment shown in FIG. 1.

FIG. 4 is a side view describing the positional relationship between the control unit and the processing units according to the embodiment shown in FIG. 1. Control unit 107 is positioned between the processing unit 103 for etching and the processing unit 104 for ashing. The control unit 107 is equipped with controllers 401 and 402 for controlling the supply to the units.

According to the present embodiment, the control unit 107 houses plural flow controllers for controlling the volume and rate of flow of gases and refrigerants used for processing performed in the etching unit 103 and ashing unit 104 and for controlling the temperature of samples inside the processing chamber. Especially, in the inner side of the control unit 107, the flow controller for the etching unit is disposed in the upper area and the flow controller for the ashing unit is disposed in the lower area. Access doors 403 and 404 for maintenance and replacement of the devices including these flow controllers housed in the control unit are provided in the upper and lower areas of the control unit 107.

The control unit houses, for example, storage units for liquid and gas such as refrigerant and water to be supplied to the processing chamber, valves for controlling the flow thereof, and drive means such as motors for driving the valves. Such controllers are prepared to correspond to each of the plural processing chambers. This is because the present processing unit is arranged to be detachably attached to the transfer chamber 112 or the apparatus main body 100, the single apparatus main body 100 being equipped with plural processing units for subjecting the wafer (sample) to different processes, and the present apparatus is characterized in enabling various processes to be performed in the single apparatus, by preparing various processing units and attaching/replacing the units to correspond to necessary processes. It is desirable to independent controls being performed for each of the various processing units in order to carry out most appropriate processing conditions and apparatus operation.

According to such vacuum processing apparatus, the control units 107 and 107' of the present embodiment are disposed between two processing units, so as to facilitate connection to the units. Thus, the work related to attaching and detaching the processing units and control units is facilitated, and the work time is reduced.

Moreover, the equipments in the control units 107 and 107' corresponding to the various processing units are disposed vertically in the units, thereby reducing necessary installation space. Since the present embodiment utilizes the space between the processing units effectively, the distance between the processing units is minimized, and the footprint of the whole apparatus is reduced. Further, it becomes easy to cut down the difference in the distances of fluid flow paths connected to the processing chambers. Therefore, the difference in flow paths to the processing chamber before and after replacing the processing unit or the processing chamber is suppressed. Thus, the present embodiment can suppress the occurrence of difference in performance before and after maintenance, replacement or attachment of a different unit, thereby facilitating the control to be performed by the control unit 107 and improving the yield of the whole apparatus.

Figure 5:
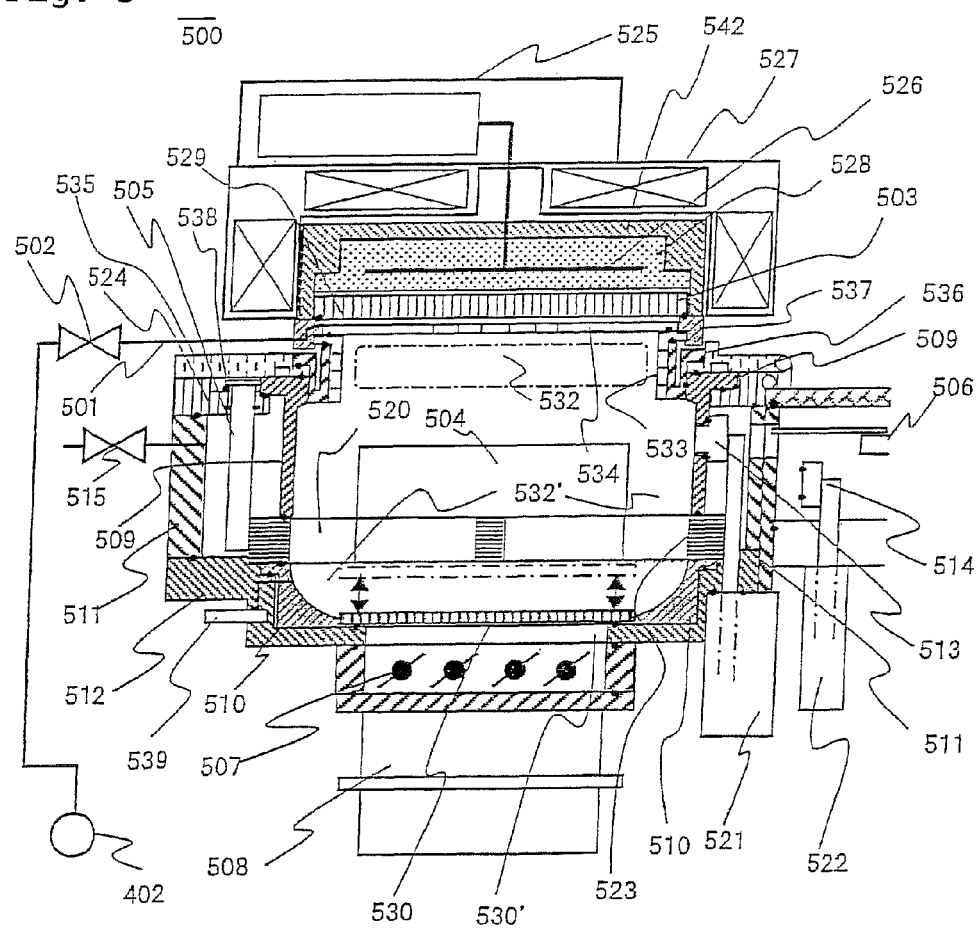
FIG. 5 is a vertical cross-sectional view showing the outline of the structure of a processing chamber portion which is one of the processing units shown in FIG. 1.
Figure 6:
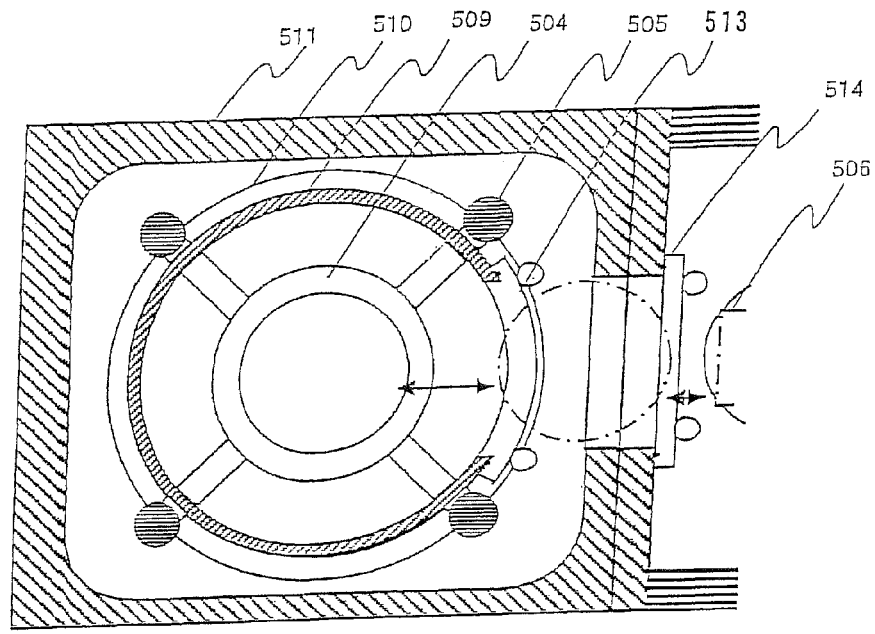
FIG. 6 is a horizontal cross-sectional view showing the structure of the processing chamber portion of the processing units shown in FIG. 5.

Next, FIGS. 5 through 10 are referred to in describing the details of the structure of the processing unit according to the present embodiment. First, FIGS. 5 and 6 are used to describe the characteristic structure of the processing unit. FIG. 5 is a vertical cross-sectional view showing the general structure of the processing chamber portion in the processing unit shown in FIG. 1. FIG. 6 is a horizontal cross-sectional view showing the structure of the processing chamber portion of the processing unit shown in FIG. 5. It especially illustrates the structure of the processing chamber portion of the etching unit 103.

In the present drawing, a processing chamber portion 500 constituting the upper part of the processing chamber portion 103a is connected to a transfer chamber 112, and the communication therewith is opened/closed by an atmospheric gate valve 514 disposed therebetween and driven to open/close. When the atmospheric gate valve 514 is opened, the inner space of the transfer chamber 112 and the inner space of the processing chamber portion 500 communicate, and the pressure of the two chambers become substantially equal. While the atmospheric gate valve 514 is opened, the wafer (sample) is transferred from the transfer chamber 112 onto a sample stage 504 disposed within the processing chamber portion.

According to the present embodiment, after confirming that the sample is mounted on the sample stage 504, the atmospheric gate valve 514 is closed and the communication between the interior of the processing chamber portion 500 and the interior of the transfer chamber 112 is closed, and the processing chamber portion is sealed before starting the process. When it is necessary to detach the processing chamber portion 500 from the transfer chamber 112, or to perform maintenance operation thereof, the atmospheric gate valve 514 is shut and the interior of the processing chamber portion 500 is raised to atmospheric pressure, before opening outer chambers 511 and 512 defining the vacuum vessel of the processing chamber unit 500 and exposing the interior to the atmosphere.

As shown in the drawing, a discharge chamber portion 1001 is disposed on the upper area of the processing chamber 500, and the discharge chamber portion 1001 is composed of a lid member 542 constituting the lid of the vacuum vessel, an antenna member disposed in the inner side of the lid member 542, a magnetic field generating unit disposed on the side and upper areas of the antenna member so as to surround the discharge chamber, and a ceiling member disposed below the antenna member. Above the magnetic field generating portion is disposed an electronic wave source 525 for supplying UHF- and VHF-band waves discharged through the antenna member. The antenna member has a flat-plate antenna 526 formed of a conductive member such as SUS disposed within the lid member 542, and at least one dielectric member 528 disposed between the antenna 526 and lid member 542 to insulate the two and also having a ring-like shape to conduct the electric waves radiated from the antenna 526 to the ceiling member disposed below.

Further, the ceiling member has a (quartz) plate 503 formed of a dielectric member such as quartz for transmitting the conducted electric waves into the processing chamber below, and a shower plate 534 placed beneath the quartz plate having plural holes for introducing the process gas being supplied into the processing chamber.

The space below the shower plate 534 and above the sample stage 504 is a discharge chamber 532 in which plasma is generated by the interaction between the supplied process gas, the electric waves introduced through the quartz plate 503 and the magnetic field supplied by the magnetic field generating portion. There is a very fine gap disposed between the quartz plate 503 and the shower plate 534, into which space the process gas to be supplied into the discharge chamber 532 is first supplied, and through the holes disposed in the shower plate 534 to communicate this gap and the discharge chamber 532, the process gas is introduced into the discharge chamber 532. This space functions as a buffer chamber 529 through which the process gas dispersed via the plural holes is flown into the discharge chamber. This process gas is supplied via a process gas line 501 and a process gas valve 502 from a controller 402 that controls the supply of fluid such as gas into the processing unit 103.

Thus, the process gas is introduced in dispersed manner through the plurality of holes into the discharge chamber 532, the holes being positioned mainly in the area confronting the position on which the sample is mounted on the sample stage 504, so along with the function of the buffer chamber 529 for dispersing the gas in a more uniform manner, the plasma density is made more uniform. Further, a lower ring 537 is disposed below the lid member 542 and on the outer circumference of the quartz plate 503 and the shower plate 534, and a gas passage that communicates with a gas line 501 through which process gas flows is disposed in the lower ring 537.

Below the shower plate 534, an inner wall member 533 of the discharge chamber that is exposed to plasma within the vacuum vessel to define the space of the discharge chamber 532 is disposed to contact the lower surface of the lower ring 537 and the shower plate 534. An outer wall member 536 of the discharge chamber is disposed outside and surrounding the inner wall member 533, wherein the outer surface of the inner wall member 533 and the inner surface of the outer wall member 536 confront and contact each other. In the present embodiment, the inner wall member 533 and the outer wall member 536 are each disposed substantially cylindrically, and the surface temperature of the inner wall member 533 is controlled by adjusting the temperature of the outer wall member 536 that contacts the inner wall member.

A discharge chamber base plate 535 is disposed on the outer circumference side of the outer wall member 536, which contacts the lower face of the member 536. The bottom surface of the discharge chamber base plate 535 contacts the vacuum chamber portion disposed below. The inner wall member 533 functions also as a ground electrode with respect to the sample stage 504 functioning as an electrode and the plasma within the discharge chamber 532, and it has a required area for stabilizing the plasma potential. In order to function as the ground electrode, it is necessary to ensure sufficient heat conductivity and electric conductivity with the outer wall member 536 or the lid member 537 that it is in contact with.

The inner wall member 533, the outer wall member 536 and the lid member 537 are all formed of members having conductivity, and are exposed to the atmospheric side outside the processing chamber portion 500 so that the connection for ground wiring is facilitated.

According to the present embodiment, the surface temperature of the wall constituting the vacuum chamber is controlled to adjust the interaction of the surface with the plasma and the particles, the gas and reaction products contained therein. Thus, by appropriately controlling the interaction between the plasma and the vacuum chamber wall surface exposed to plasma, the density of the plasma and the characteristics of the plasma such as the composition thereof can be controlled to the desired status.

According to the present embodiment, medium passage 541 is disposed in the inner side of the discharge chamber base plate 535 through which a heat exchange medium flows, and by recycling the flow of the heat exchange medium such as water in the medium passage 541, the temperature of the discharge chamber base plate 535 is adjusted, and the temperature of the inner chamber 509 is adjusted via the member disposed between and connecting the base plate 535 and the inner chamber 509. In other words, the discharge chamber base plate 535 and the side wall of the inner chamber 509 are thermally connected, and heat exchange is carried out. If heat exchange through transmission of heat is possible, a separate member can be disposed between the base plate and the inner chamber.

For the sample being the object of processing to be mounted on the sample stage 504 of the inner chamber 509 and 510, a gate must be provided to the inner chamber 509 or 510 through which the wafer is transferred into the chamber. Further, a valve is required for closing and opening the communication between the inner and outer spaces of the chamber when the gate is sealed.

The present embodiment is equipped with an atmospheric gate valve 514 for opening and closing a gate disposed between the inner side of the processing chamber portion 500 and the inner side of the transfer chamber 112 to open/close the communication therebetween, and a process gate valve 513 for opening and closing the communication between the inner side and the outer side of the inner chamber 509. The atmospheric gate valve 514 is located above the inner side wall of the transfer chamber 112 and disposed so as to be able to move both vertically and horizontally via a drive means 522, and the valve closes the gate above the inner side wall to seal the same, or opens the gate. Further, a gate is disposed on the outer chamber 509 constituting the vacuum vessel at a position corresponding to the gate on the side of the carriage chamber 112 when the carriage chamber 112 and the processing chamber portion 500 are connected.

This position must be determined so that a sample carrier device 506 which is a robot arm for transferring the wafer within the transfer chamber 112 does not interfere with the gate. Further, a process gate is disposed at a position facing the gate of the outer chamber or the gate of the transfer chamber 112 in the state in which the inner chamber 509 is disposed within the outer chamber 511, and the wafer is transferred through this gate.

Further, a process gate valve 513 for opening or closing and sealing this process gate is disposed in the space between the outer chamber 511 and the inner chamber 509, and the process gate valve 514 is designed to move both vertically and horizontally via a drive means 521 disposed below. When closed, the valve 513 is positioned on the side wall of the inner chamber 509 to seal the gate, and it can also be opened. The process gate is positioned and designed so that it does not interfere with the movement of the robot arm transferring the wafer in the transfer chamber.

The gate valves are opened during wafer carriage so as to prevent any problems from occurring. When processing the wafer, the innermost gate valve, which in the present embodiment is the gate valve for closing the gate disposed in the inner chamber 509, the process gate valve 513, and the atmospheric gate valve 514 are closed and sealed, shutting the communication between the inside and the outside. When detaching the processing chamber, or when opening the vacuum vessel during maintenance etc., the atmospheric gate valve 514 is left closed, while the process gate valve 513 is opened to communicate the inside and the outside of the inner chamber 509 within the outer chamber 511. At this time, the process gas valve 512 is operated to shut the process gas line 501, so as not to have process gas supplied to the processing chamber portion 500.

As described above, according to the present embodiment, the process gate valve 513 is opened and the inner and outer sides of the inner chamber 509 of the outer chamber 511 is communicated to set the pressures thereof to substantially equal pressure, or to enable adjustment of the pressures. Thus, the inner chamber 509 or 510 is subjected to smaller load caused by pressure difference between the inner side and the outer side, and therefore, it becomes possible to reduce the thickness and size of the members.

When carrying out maintenance operation of the inner side of the outer chamber 511 which is the vacuum vessel of the processing chamber portion 500, the atmospheric gate valve 514 is closed to seal the interior of the outer chamber 511, and after confirming the same, the process gate valve 513 is opened. With the process gate opened and the spaces inside and outside the inner chamber 513 communicated, the atmospheric release valve 515 is opened to communicate the outside and the inside of the processing chamber portion 500, thereby raising the pressure in the outer chamber 511 and 512 within the processing chamber portion 500 to substantially reach atmospheric pressure, or in other words, carrying out atmospheric release.

After performing atmospheric release, the inside of the processing chamber portion 500 is opened. First, the lid 503 disposed above the outer chamber 511 of the processing chamber portion 500 and sealing the inside of the chamber is pulled up and opened. At this time, it is possible to use a crane or the like to pull the lid up, but it is also possible to provide a hinge in advance, and to flip the lid up around the hinge to open the lid 180 degrees or more. Next, the maintenance work of the inner chamber 509 is carried out. In order to facilitate this maintenance work such as cleaning, repairing and replacing, the inner chamber 509 can be taken out of the outer chamber 511 and detached from the processing chamber portion 500.

As described, since it is possible to control or maintain the inside and the outside of the inner chamber 509 to substantially equal pressure, the thickness of the chamber member can be reduced. Therefore, the weight of the inner chamber 509 is reduced and the handling such as removing thereof becomes facilitated, by which the work time is reduced and the operation efficiency of the apparatus improved.

Figure 7:
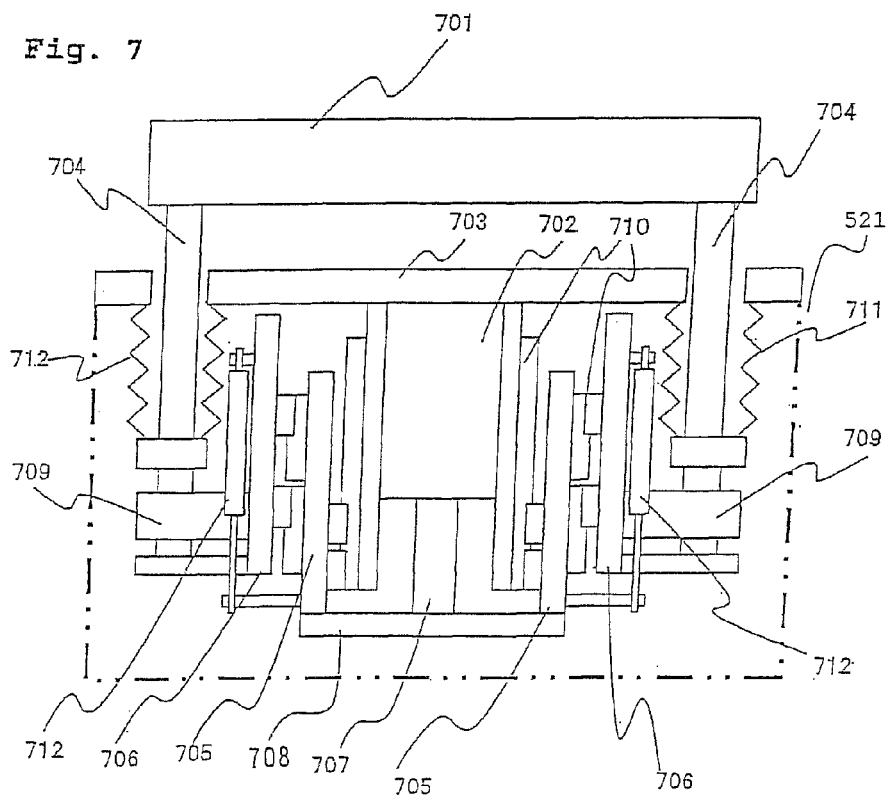
FIG. 7 is a vertical cross-sectional view showing the whole structure of the gate valve shown in FIG. 5.

FIG. 7 is a vertical cross-sectional view showing the whole structure of the gate valve shown in FIG. 5. In the present drawing, the gate valve 513 is largely divided into a valve body 701 and a drive means 521 disposed below the valve body, which are connected by a pair of connecting means disposed on both ends of the valve body 701.

The drive means 521 is mainly composed of an actuator 702 that is connected to the valve body 701 for moving the same in both the vertical and horizontal directions, a plate connected to the actuator, and an upper guide 703 constituting the upper end portion of the drive means 521. Further, the valve body 701 is connected to the drive means 521 via a pair of support pillars 704 disposed on both ends of the drive means, and supported by the drive means 521.

In the present embodiment, a plural number of said plates are disposed on both ends of the valve body 701 on the actuator 702, and these plates connect the actuator 702 and the support pillars 704, and as a result, connect the valve body 701. In FIG. 7, there are two plates disposed on the two sides respectively, and on one side, there is an actuator-side plate 705 disposed close to the actuator 701 and the support pillar-side plate 706 disposed close to the pillar.

The lower end of the actuator-side plate 705 and a piston 707 of the actuator 702 are connected via an actuator-side base member 708, and the actuator-side plate 705 is moved up and down along with the movement of the actuator 702. Further, on the bottom portion of the support pillar-side plate 706 is attached a pillar support portion 709 that is connected to the lower end of the support pillar 704, by which the support pillar-side plate 706 and the support plate 704 are connected, so that the support pillar 704 and the valve body are moved substantially in the same direction along with the movement of the support pillar-side plate 706 in the predetermined direction. Between these plates and the actuator 702 is disposed a linear guide 710, which is a guide member composed of a guide rail and a slide that is engaged with and slides along the guide rail. Further, a damper 712 connecting the lower portion of the actuator-side plate 705 and the upper portion of the support pillar-side plate 706 is disposed on the support pillar-side of each plate.

As described, the pair of support pillars 704 disposed on both ends of the valve body 701 is connected to the drive means 521 by connecting the valve body 701 and the support pillar-side plate 706. By the support pillars 704 disposed on both rear ends of the valve body 701, the vibration generated by the movement of the valve body 701 is suppressed, and especially, the vibration revolving around the center portion of the valve body 701 as axis is reduced.

According to the present embodiment, the space around each pillar, starting at the opening disposed on the upper guide 703 of a through hole having the support pillar 704 disposed therein and ending at a pillar support portion 709, is sealed airtightly by a bellows 711, and thereby, the space in which the valve body 701 is disposed and the space inside the drive means 521 defined by the upper guide 703 and the bellows 711 are separated to the vacuum side and atmospheric side.

According to this arrangement, the valve body 701 is moved upward from a low position and then moves substantially horizontally with respect to the opening of the process gate 513, to cover the opening and to airtightly seal the inside of the opening from the outside. Oppositely, the valve body 701 closing the opening is moved substantially horizontally to release the opening and then moves downward.

Figure 8:
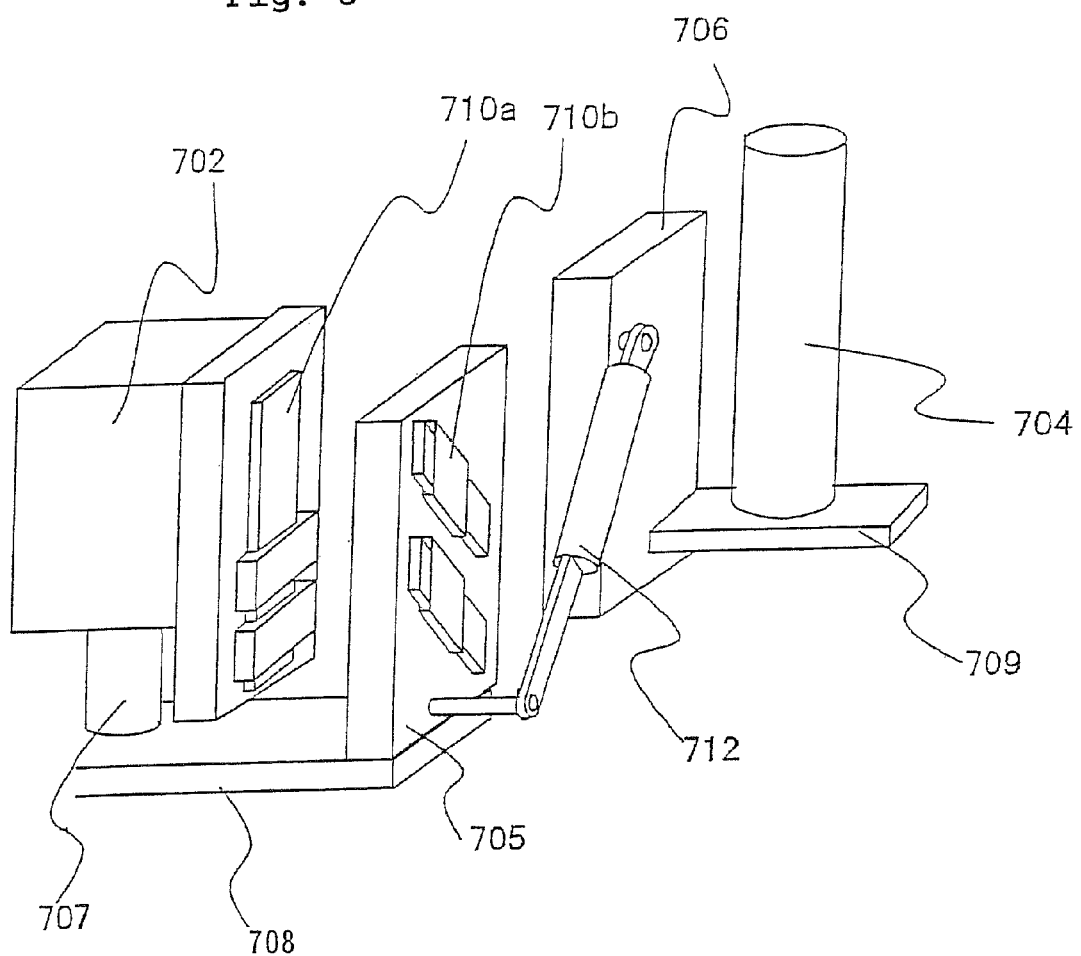
FIG. 8 is a frame format showing in enlarged view the relevant portion of one side of the drive means shown in FIG. 7.

FIG. 8 is an explanatory view showing in enlarged state the arrangement of the relevant portion on one end of the drive means shown in FIG. 7. In the drawing, the connection between the two plates disposed on one side of the actuator 702, the guide member such as the linear guide disposed therebetween, and the support pillar 704, is illustrated.

The actuator 702 and the piston 707 constituting a part of the actuator is connected with the actuator-side base member 708, and through this actuator-side base member 708 the actuator-side plate 705 is connected with the actuator 702. Further, a linear guide 710a is disposed on the side wall of the actuator 702, which connects with the actuator-side plate 705. This linear guide 710a is disposed so that a guide rail is disposed on the side wall of the actuator 702 along the direction of movement of the actuator 702, and a slide movable along the guide rail is connected to the actuator-side plate 705, so the plate 705 is moved vertically along the linear guide 710a accompanying the movement of the actuator 702.

Further, the surface of the actuator-side plate 705 facing the support pillar-side plate 706 is provided with a plurality of linear guides 710b that are arranged substantially in parallel. The slider portion of the linear guides 710b is connected to the support pillar-side plate 706. The direction in which the slider moves via the linear guide 710b, that is, the direction in which the support pillar-side plate 706 moves with respect to the actuator-side plate 705, is arranged in a crossed direction when seen from the support pillar 704 (the end of the valve body 701) toward the center side area of the drive means 521. Along with the movement of the actuator 702, the actuator-side plate 705 and the support pillar-side plate 706 are guided by the linear guide 710a connected thereto and moves in two directions determined by the linear guide 710a.

The lower portion of the support pillar-side plate 706 is connected via the pillar support member 709 to the support pillar 704, and the actuator-side base member 708 on the lower end of the actuator 702 is arranged to support via the member disposed therebetween the support pillar 704 and the valve body 701 connected thereto. Further, a damper 712 disposed between and connecting the lower area of actuator-side plate 705 and the upper area of the support pillar-side plate functions both to damp the relative movement of the two plates and to bias the connection of the two plates by a member having elasticity disposed therein. In other words, there is a load forcing the support pillar-side plate 706 diagonally upward along the axial direction of the damper 712 seen from the actuator-side plate 705. Therefore, according to the present embodiment, with the actuator 702 positioned downward, the damper 712 or the linear guide 710b is positioned at its maximum movable end within the range that the upper end of the support pillar-side plate 706 does not contact the upper guide 703. For example, the damper 712 is at its maximum extended state.

Figure 9:
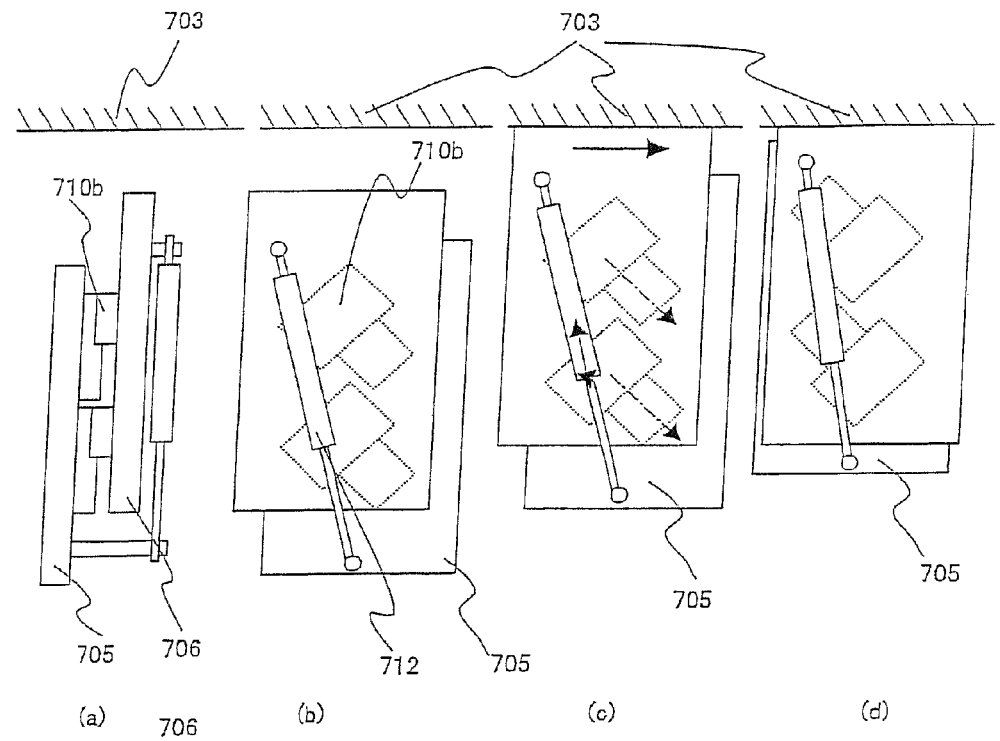
FIG. 9 is a frame format explaining the movement of the drive device shown in FIG. 8.

FIG. 9 is a schematic view illustrating the movement of the drive apparatus shown in FIG. 8. Especially, the movement of the actuator-side plate 705, the support pillar-side plate 706 and the damper 712 seen from the side of the drive apparatus (the direction viewed from one support pillar toward the center actuator) are illustrated. In the drawing, FIG. 9(*a*) is a view showing the arrangement of components on one end of the actuator 702 seen from the front side of the drive means 521. FIGS. 9(*b*) through 9(*d*) are schematic diagrams showing the arrangement of the same side seen from the side direction of the drive means 521, and illustrates the state in which the actuator-side plate 705 and the support pillar-side plate 706 are moved upward and upper rightward, respectively, in the drawing according to the movement of the actuator 702 from the lower end to the upper end.

FIG. 9(*b*) shows the state in which the actuator 702 is at its lower end position, and in this state, the actuator-side plate 705 connected via the actuator-side base member 708 is also at its lower end position. In this state, as described, the support pillar-side plate 706 is pushed up and positioned at the oblique upper left of the actuator-side plate 705 by the flexible bias force provided by the damper 712, its position determined to correspond to the end of movable range of the damper 712 or the linear guide 710b. Further in this state, the upper end of the support pillar-side plate 706 is not in contact with the bottom surface of the upper guide 703, and a space is maintained therebetween.

FIG. 9(c) shows the state in which the actuator 702 is moved upward for an arbitrary distance, along with which the actuator-side plate 705 is moved upward. The present drawing shows the state in which the actuator 702 is driven to a position in which the upper end of the support pillar-side plate 706 is in contact with the bottom surface of the upper guide 703. By driving the actuator 702 from the lower end up to this position, the support pillar-side plate 706 is moved to substantially the same direction as the actuator-side plate 705, that is, to the upper direction. Further, the valve body 701 supported at the upper end of the support pillar 704 is moved from below the process gate valve 514 to the position corresponding to the height of the opening. The valve body 701 positioned to be in contact with the upper guide 703 faces the opening of the inner chamber 509 in the horizontal direction. In FIG. 9(d), further operation of the actuator 702 moves the actuator-side plate 705 further upward.

On the other hand, the upper end of the support pillar-side plate 706 contacts the upper guide 703 disposed on the same direction as the direction of movement of the actuator-side plate 705, and further movement toward that direction is restricted. In this state, the actuator-side plate 705 and the support pillar-side plate 706 interact by the linear guide 710b disposed between the two plates and having a direction of movement positioned slantwise with respect to the direction of movement of the actuator 702, and the support pillar-side plate 706 is moved to a direction relatively crossing the actuator-side plate 705.

In other words, when viewed from the actuator-side plate 705, the support pillar-side plate 706 moves along the direction of the guide rail of the linear guide 710b. The directions of movement of the two plates form an obtuse angle when viewed from the drive means 521. That is, along with the upward movement of the actuator-side plate 705, the support pillar-side plate 706 is moved relatively downward (to the direction opposite to the moving direction of the actuator-side plate 705), and moves substantially horizontally along the bottom surface of the upper guide 703. If this movement is viewed from outside the drive apparatus 521 or the vacuum processing apparatus body, the valve body 701 is moved substantially horizontally along the bottom surface of the upper guide 703, and when (or before) the actuator 702 reaches the upper end of its movement range, the valve body contacts the outer wall surface of the inner chamber 509 and closes the opening of the process gate valve disposed thereto.

Moreover, it is possible to coat a resin material such as Teflon (registered trademark) on the contact surface on either the upper end of the support pillar-side plate 706 or the bottom surface of the upper guide 703 in order to reduce the friction drag during slide movement. Further, when the support pillar-side plate 706 is moved in the horizontal direction, the repulsive force of the damper 712 connecting the actuator-side plate 705 and the support pillar-side plate 706 presses the support pillar-side plate 706 upward toward the bottom surface of the upper guide 703 with respect to the actuator-side plate 705. Thanks to the biasing and shock absorbing functions of the repulsive force of the damper 712, the vibration of the two plates is reduced or damped, and as a result, the vibration of the valve body 701 is reduced or damped.

Figure 10:
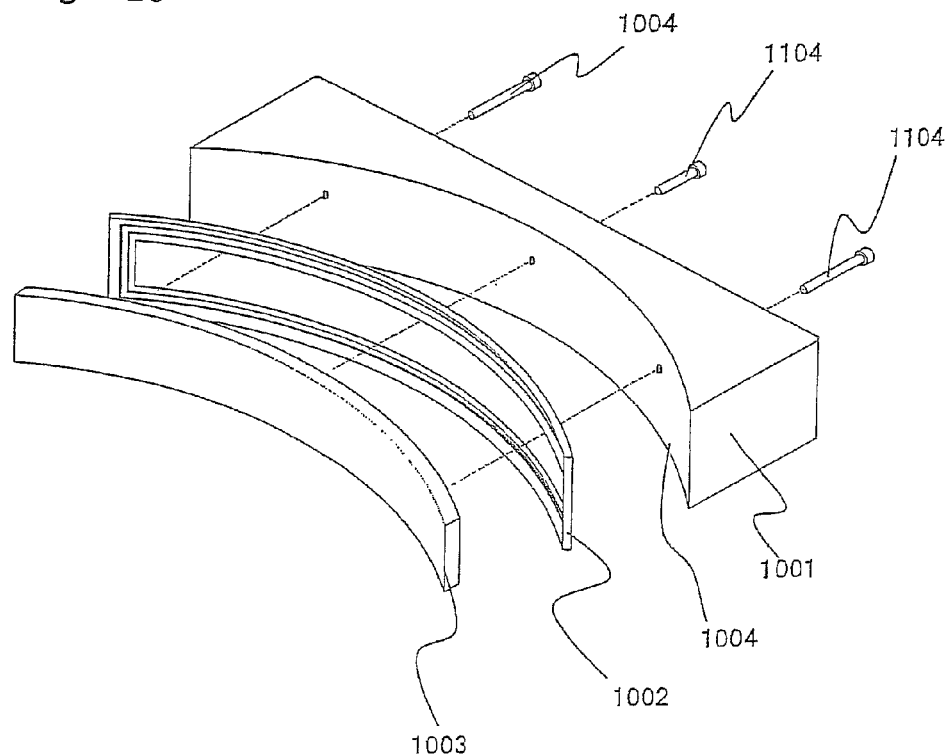
FIG. 10 is a perspective view showing the outline of the whole structure of the valve body shown in FIG. 7.

FIG. 10 is a perspective view showing the outline of the whole structure of the valve body illustrated in FIG. 7. In the drawing, the valve body 701 is largely divided into three parts, a base body 1001 being the main body of the valve body, a seal member 1002 having elasticity attached to the side of the base body 1001 facing the opening, and a cover 1003 attached to the base body 1001 for positioning the seal member.

The seal member 1002 is sandwiched between and connected to the base body 1001 and the inner chamber 509 when the valve body 701 contacts and thereby closes the opening disposed in the inner chamber 509, and functions to airtightly seal the inside of the opening from the outside, that is, the inside of the inner chamber 509 from the outside. In the present embodiment, the seal member 1002 is formed of a resin having resistance to corrosive gas. The cover 1003 is for pressing and positioning the seal member 1002 against the base body 1001, and according to the present embodiment, the position of the seal member 1002 is fixed by sandwiching the same between the base body 1001. The cover 1003 and the base body of the valve body 701 are securely fixed via plural connecting bolts 1004 that are inserted from the back of the base body 1001, that is, the side opposite to the side facing the opening.

The seal member 1002 is disposed on the surface of the base body 1001 that faces the opening, and when the valve body 701 is in contact with the inner chamber 509 and closes the gate valve 513, this surface is opposed to the outer wall surface of the inner chamber 509 via the seal member 1002, by which the seal member 1002 attached to this surface constitutes a seal surface 1005 that seals the inside of the opening from the outside.

The seal surface 1005 disposed on the side facing the opening or the side of the valve body facing the outer wall surface of the inner chamber 509 has a smooth curved surface corresponding to the outer wall surface of the inner chamber 509, and there are no grooves or dents like in the examples of the prior art for fitting and positioning the seal member.

This smooth curved surface corresponds to the outer wall contour of the inner chamber 509, and if the contour of the wall on which the valve means contacts is flat, it can have a flat surface, and if the gate valve opening corresponds to the opening between the transfer chamber and the processing chamber or to the opening of the load lock chamber, it can be designed to correspond to the contour of the wall surface of the component on which the opening is disposed.

So that grooves or dents for positioning the seal member 1002 are not required on the seal surface 1005 as described, the fixing of the seal member 1002 is performed using the structure disposed in the seal surface side of the cover 1003 that is attached to the surface of the seal member 1005 and engaged to the valve body 701.

Figure 11A:
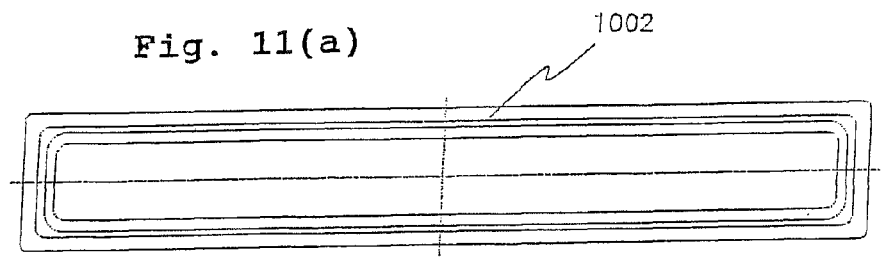
FIG. 11 is a front view and a cross-sectional view showing the outline of the structure of the seal member shown in FIG. 10.

FIG. 11 shows a front view and a side view of the schematic structure of the seal member illustrated in FIG. 10. In FIG. 11(a), the seal member 1002 is arranged so that it is substantially rectangular when viewed from the opening (front) side, with the center side opened. According to the present embodiment, a cover 1003 is attached to the center side thereof, that is engaged with the seal member 1002 positioned on the circumference thereof.

Figure 11B:
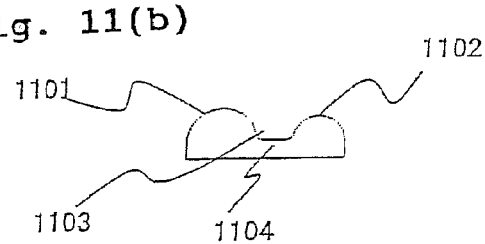

FIG. 11(b) is a cross-sectional view showing the seal member 1002 cut at a surface perpendicular to the seal surface 1005. As illustrated, the seal member 1002 has plural projections (two in the present embodiment) on one side and a flat surface on the other side. According to the present embodiment, an outer projection 1101 positioned on the outer circumference side of the seal member 1002 and illustrated on the left side of the drawing has a height from the flat surface that is higher than the height from the flat surface of an inner projection 1102 positioned in the inner circumference side. Between the two projections 1101 and 1102 is disposed a constriction 1103 which extends to the projection 1102 or 1101 and is thinner than the projections.

The flat surface disposed in the other side constitutes a valve body contact surface 1106 that comes in planar contact with the seal surface 1005 when the valve body 701 closes the opening.

Figure 12:
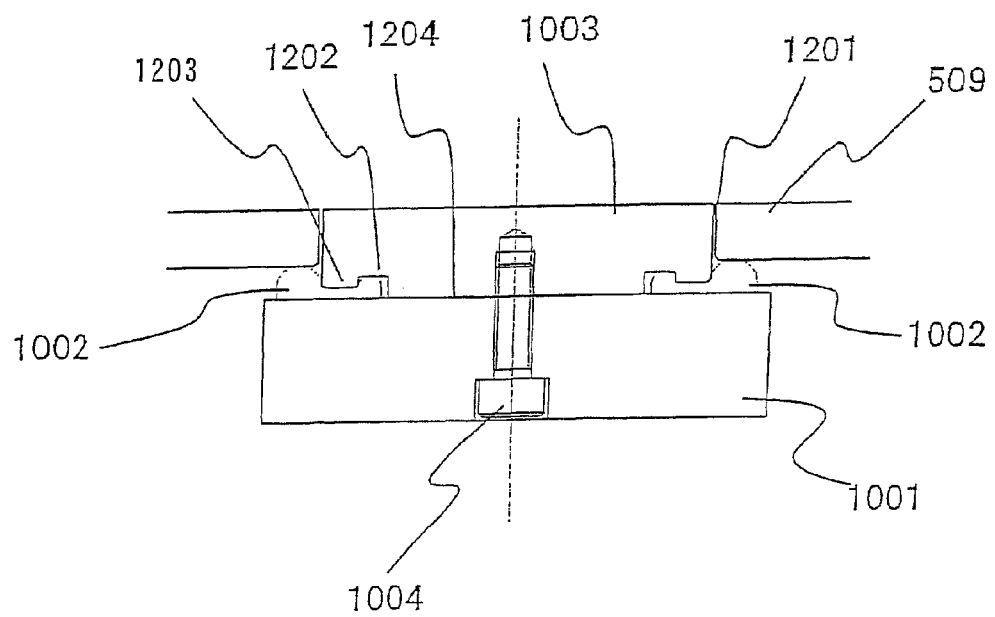
FIG. 12 is a cross-sectional view showing the outline of the state in which the valve body is in contact with and sealing the opening of the inner chamber.

FIG. 12 is a cross-sectional view showing the schematic structure of the valve body 701 illustrating the state in which it is in contact with the inner chamber 509 and sealing the opening 1201. As shown, the seal member 1002 on the seal surface 1005 of the valve body 701 is disposed along the outer circumference of the cover 1003 and the seal surface, and the curved surface on the upper side of the outer circumference-side projection 1106 contacts the outer wall surface of the inner chamber 509 surrounding the opening 1201.

Further, the connecting bolt 1004 is inserted and connected to the base body 1001 of the valve body 701 from the side opposite from where the opening 1201 is positioned. The connecting bolt 1004 and the screw hole in which the bolt is inserted is designed to have a length reaching halfway of thickness of the cover 1003 so as to improve the sealing ability and also considering the influence of the corrosive gas.

As described, the cover 1003 is disposed within the center opening area of the seal member 1002 to be connected to the valve body base 1001 and to determine the position of the seal member 1002. The side of the cover 1003 facing the seal surface 1005 is provided with a surface disposed in the center thereof to be connected to the seal surface 1005, and the outer circumference area thereof is provided with an arrangement that engages with the seal member 1002, including an outer circumference dent 1202 and an outer circumference end projection 1203 that is disposed further on the outer circumference end of the cover 1003. When attached to the base body 1001, the cover 1003 is arranged so that the circumference end projection 1203 presses the constriction 1103 of the seal 1002 toward the seal surface side and positions the same on the seal surface 1005. Further, with the cover 1003 attached, the circumference dent 1202 contacts the inner projection 1102 of the seal member 1002, pressing the same toward the seal surface 1005 and holding the seal member 1002 between the seal surface 1005. In this state, the curved surface of the projection on the inner projection 1102 contacts the surface of the circumference dent 1202 and seals the space between the outer circumference side and the inner circumference side of the cover 1003 in this contact area.

In the present embodiment, the side of the seal member 1002 in contact with the seal surface 1005 is not provided with projections or dents, but the inner projection can be disposed on the side in contact with the seal surface 1005, and in doing so, it is possible to dispose a dent on the seal surface 1005 and to enable the curved surface on the inner projection and the surface within the dent to contact and dispose a seal within this dent. By connecting the cover with the valve body base via a connecting bolt at the center of the cover, and by providing a sealed region within the inner circumference side of the cover 1003, it is possible to prevent corrosive gas sealed by the outer circumference projection 1101 from flowing toward the center area of the cover 1003. By positioning the connecting bolt 1004 on the center area of the sealed cover, the corrosion of or other undesirable influence on the connecting bolt 1004 can be prevented.

Further, as illustrated in FIG. 12, while the valve body 701 is sealing the opening 1201, the cover 1003 projected from the seal surface 1005 is positioned to enter the inner side of the opening 1201, and the surface of the cover 1003 constitutes a substantially equal smooth surface with the inner wall surface of the inner chamber 509. Thus, the influence that the inner contour of the processing chamber being circumferentially uneven has on the process performed in the inner chamber in which plasma processing using gas is performed is reduced, and the process can be carried out more uniformly. Further, tolerance requires a gap to be disposed between the cover 1003 and the opening 1201, but on the valve-body-side of the gap, the boundary between the seal member 1002 and the side wall of the cover 1003 is located. This boundary portion constitutes the boundary between the side wall of the cover 1003 and the outer circumference projection 1101 of the seal member 1002, thereby preventing the corrosive gas in the gap from entering and influencing the weak portions of the seal member 1102.

According to the above-described embodiment, the drive means for moving the valve body to open or close the opening is designed to connect two members disposed in correspondence to two directions, and by moving the members in interlocked manner, moves the valve body substantially in the horizontal direction, that is, moves the valve body confronting the opening closer to the opening so as to seal the same or to separate therefrom, according to which arrangement the distance of movement toward or away from the opening is increased. If a movement along a single guide is adopted as in the prior art, it is necessary to guide the member along a curved path with the attempt to continuously carry out a number of actions in the crossing directions, which was difficult to realize using a drive means oriented to a single direction, and it was also difficult to increase the distance of movement of the valve body in plural directions.

According to the arrangement of the present embodiment, two members are provided that move along two substantially linear directions, with guide members that are moved in the respective directions. Each guide means corresponding to a single direction is easy to manufacture, and by applying the same level of manufacturing technology, it is possible to improve the accuracy thereof. Moreover, by applying a ball bearing or a fluid to pressurize the engagement of the guide composed of a guide rail and a slide, the accuracy thereof can be further improved. Thus, the vibration of components generated by the movement of the guide can be reduced or suppressed.

Even further, the interlocked connection of members corresponding to the above-mentioned two substantially linear directions enables the opening and closing action of the valve body. Therefore, when pressing the valve body into the opening for seal and when pulling out the same from the sealed state, a force greater than that applied according to the prior art arrangement can be applied. Therefore, the output of the actuator can be reduced and the apparatus can be downsized.

Moreover, by connecting the members corresponding to each of the plural directions, the arrangement of the damper for suppressing the vibration of the valve body or the vibration between the actuator-side plate and the support pillar-side plate becomes facilitated. This damper not only damps vibration, but also provides biasing force so as to constantly apply a load between the actuator-side plate and the support pillar-side plate, so as to prevent vertical vibration caused by the friction drag between the support pillar-side plate and the upper guide.

The valve body is connected to and supported by the support pillars at its both ends. The vibration of the valve body is suppressed by the plural pillars, and the rotating movement of the valve body around the center axis is converted to the displacement of the support pillars. Since the displacement movement is substantially linear instead of a rotation, it can be more easily suppressed or damped by the function of the guide, the movement of the plates and the work of the damper, according to which the vibration can be easily suppressed or attenuated. The direction of arrangement of the damper is set to substantially the same direction as the relative movement of the support pillar-side member by the guide. Thus, the damping and attenuation functions are further improved.

Moreover, in the sealing area, the flat surface on the valve body-side of the seal is in planar contact with the seal surface of the valve body. Further, the cover presses the seal member and positions the same on the seal surface. Thereby, it becomes unnecessary to dispose grooves or dents which are difficult to process, so the work efficiency is improved and the manufacture costs are reduced. It is especially difficult to dispose grooves or dents when the seal surface has a curved shape, and much work is required to fit the seal member to position, and the seal performance may be deteriorated by the distortion of the seal member. The present invention provides a cover that performs positioning, by which the assembly work is facilitated, and as a result, the work efficiency of the apparatus is improved. In other words, by the connection between the seal member and the seal surface which have flat, smooth or curved surfaces, the movement of the seal member is restricted, and the deterioration or failure of the seal performance by the distortion of the seal member can be suppressed.

Moreover, the present invention provides projections disposed on both sides of a constriction of the seal member, and the constriction is pressed and positioned using a cover. Since the constriction is pressed and pinched, the deformation of the outer projection on the seal surface becomes facilitated, and especially, the deformation to the direction along the seal surface becomes facilitated. According to such arrangement, it is possible to prevent the contact position of the projection from being displaced when the seal contacts the outer wall of the chamber having a curved surface and scratching the outer wall, according to which the generation of contaminants is suppressed. Further, even if one-side hitting of the valve means is caused, the distortion (twisting) of the seal member is suppressed, and the deterioration or failure of the seal performance is prevented.

What is claimed is:

1. A valve which contacts with a wall surface around an opening disposed on a chamber and opens and closes the opening in an air-tight manner, comprising:
    a main body which moves confronting the opening closer thereto and separating away therefrom;
    a seal member disposed on a surface of the main body in a side on which the main body confronts the opening, the seal member being circular shaped and, when the valve closes the opening in the air-tight manner, contacting the wall surface around the opening in being sandwiched between the surface of the main body and the wall surface so that the seal member can seal inside of the opening; and
    a cover disposed on the main body in the side on which the main body confronts the opening, the cover pressing the seal member toward the main body to hold a position of the seal member on the surface of the main body,
    wherein the seal member includes a first projecting portion having a curved surface which contacts with the wall surface and an overhang extending from the first projecting portion along the surface of the main body which is engaged with and pressed onto the surface of the main body by the cover when the cover is disposed on the surface of the main body, and
    wherein the overhang includes a constriction portion, a thickness of which is smaller than that of the first projecting portion.

2. A valve according to claim 1, wherein the first projecting portion of the seal member is disposed on a flat or smooth curved surface portion of the surface of the main body in the side on which the main body confronts the opening, and has a flat or smooth curved surface in a side facing the main body which contacts with the flat or smooth curved surface portion of the surface of the main body.

3. A valve according to claim 2, further comprising a second projecting portion which is disposed at a portion of the seal member on which the cover presses, the second projecting portion contacting with the surface of the main body and the surface of the cover so as to seal the opening.

4. A valve according to claim 1, wherein the seal member further comprises a second projecting portion which is disposed in an opposite side of the first projecting portion via the overhang and contacts with a surface of the valve so as to seal the opening when the valve closes the opening.

5. A valve according to claim 4, further comprising a dent disposed on the surface of the cover in the side confronting the main body, the second projecting portion contacting with the surface inside of the dent.

6. A valve according to claim 1, wherein the inside of the chamber is depressurized and the valve is disposed outside of the chamber and is moved by a driving unit so as to contact with the surface of the wall in the chamber and close the opening in the wall of the chamber in an air-tight manner or open the opening in accordance with the driving unit to move closer to or separate from the opening.

7. A valve according to claim 1, further comprising a second projecting portion which is disposed at a portion of the seal member on which the cover presses, the second projecting portion contacting with the surface of the main body and the surface of the cover so as to seal the opening.

8. A valve which contacts with a wall surface around an opening disposed on a chamber and opens and closes the opening in an air-tight manner, comprising:
    a main body which moves confronting the opening closer thereto and separating away therefrom;
    a seal member disposed on a surface of the main body in a side on which the main body confronts the opening, the seal member being circular shaped and, when the valve closes the opening in the air-tight manner, contacting the wall surface around the opening in being sandwiched between the surface of the main body and the wall surface so that the seal member can seal inside of the opening; and
    a cover disposed on the main body in the side on which the main body confronts the opening, the cover pressing the seal member toward the main body to hold a position of the seal member on the surface of the main body,
    wherein the seal member includes a first projecting portion having a curved surface which contacts with the wall surface and an overhang extending from the first projecting portion along the surface of the main body which is engaged with and pressed onto the surface of the main body by the cover when the cover is disposed on the surface of the main body, and
    the seal member further comprises a second projecting portion which is disposed at a portion of the seal member on which the cover presses, the second projecting portion contacting with the surface of the main body and the surface of the cover so as to seal the opening.

9. A valve according to claim 8, further comprising a dent disposed on the surface of the cover in the side confronting the main body, the second projecting portion contacting with the surface inside of the dent.

10. A valve according to claim 8, wherein the first projecting portion extends to a height greater than a height of the second projecting portion.

11. A vacuum processing apparatus comprising:
a vacuum vessel inside of which is depressurized;
a process chamber disposed inside the vacuum vessel, in which a sample is to be located and processed using process gas supplied therein;
a sample stage disposed in the process chamber, on a surface of which the sample is located;
an exhaust opening disposed below the sample stage in the process chamber, through which the process gas in the process chamber is exhausted;
a vacuum pump which is coupled to the exhaust opening, to depressurize inside of the process chamber;
an opening disposed on a wall of the vacuum vessel; and
a valve which contacts with a wall surface around the opening and closes the opening in an air-tight manner and opens the same,
wherein the valve comprises:
a main body which moves confronting the opening closer thereto and separating away therefrom;
a seal member disposed on a surface of the main body in a side on which the main body confronts the opening, the seal member being circular shaped and, when the valve closes the opening in the air-tight manner, contacting the wall surface around the opening in being sandwiched between the surface of the main body and the wall surface so that the seal member can seal inside of the opening;
a cover disposed on the main body in the side on which the main body confronts the opening, the cover pressing the seal member toward the main body to hold a position of the seal member on the surface of the main body,
wherein the seal member includes a first projecting portion having a curved surface which contacts with the wall surface and an overhang extending from the first projecting portion along the surface of the main body which is engaged with and pressed onto the surface of the main body by the cover when the cover is disposed on the surface of the main body, and
wherein the overhang of the seal member includes a constriction portion, a thickness of which is smaller than that of the first projecting portion.

12. A vacuum processing apparatus according to claim 11, wherein the opening is disposed on a side wall of the vacuum vessel and a sample is transferred through the opening, and the valve is disposed outside of the vacuum vessel and is moved by a driving unit so as to contact with the surface of the wall in the chamber and close the opening in the wall of the chamber in the air-tight manner or open the opening in accordance with the driving unit to move closer to or separate from the opening.

13. A vacuum processing apparatus according to claim 12, wherein the first projecting portion of the seal member is disposed on a flat or smooth curved surface portion of the surface of the main body in the side on which the main body confronts the opening, and has a flat or smooth curved surface in a side facing the main body which contacts with the flat or smooth curved surface portion of the surface of the main body.

14. A vacuum processing apparatus according to claim 12, wherein when the valve closes the opening, the cover of the valve is positioned to enter an inner side of the opening.

15. A vacuum processing apparatus according to claim 11, wherein the first projecting portion of the seal member is disposed on a flat or smooth curved surface portion of the surface of the main body in the side on which the main body confronts the opening, and has a flat or smooth curved surface in a side facing the main body which contacts with the flat or smooth curved surface portion of the surface of the main body.

16. A vacuum processing apparatus according to claim 11, wherein when the valve closes the opening, the cover of the valve is positioned to enter an inner side of the opening.

17. A vacuum processing apparatus according to claim 11, further comprising a second projecting portion which is disposed at a portion of the seal member on which the cover presses, the second projecting portion contacting with the surface of the main body and the surface of the cover so as to seal the opening.

18. A vacuum processing apparatus according to claim 17, further comprising a dent disposed on the surface of the cover in the side confronting the main body, the second projecting portion contacting with the surface inside of the dent.

19. A vacuum processing apparatus according to claim 17, wherein the first projecting portion extends to a height greater than a height of the second projecting portion.

* * * * *